(12) United States Patent
Matsushita et al.

(10) Patent No.: US 8,878,632 B2
(45) Date of Patent: Nov. 4, 2014

(54) LAMINATED FILTER

(75) Inventors: Yosuke Matsushita, Kyoto (JP);
Masashi Miyamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 774 days.

(21) Appl. No.: 12/854,241

(22) Filed: Aug. 11, 2010

(65) Prior Publication Data
US 2011/0037540 A1 Feb. 17, 2011

(30) Foreign Application Priority Data

Aug. 12, 2009 (JP) ................................ 2009-187379
Jun. 11, 2010 (JP) ................................ 2010-134248

(51) Int. Cl.
H03H 7/09 (2006.01)
H01P 1/203 (2006.01)
H03H 7/01 (2006.01)

(52) U.S. Cl.
CPC ............. *H03H 7/09* (2013.01); *H01P 1/20345* (2013.01); *H03H 7/0115* (2013.01)
USPC .......................................... 333/185; 333/175

(58) Field of Classification Search
CPC ...... H03H 7/0115; H03H 7/0161; H03H 7/09
USPC ................................................ 333/175, 185
See application file for complete search history.

(56) References Cited

U.S. PATENT DOCUMENTS

| | | | |
|---|---|---|---|
| 6,329,715 B1* | 12/2001 | Hayashi | 257/724 |
| 2007/0159273 A1* | 7/2007 | Oshima | 333/185 |
| 2008/0247115 A1* | 10/2008 | Lee et al. | 361/277 |
| 2011/0031583 A1* | 2/2011 | Akiba et al. | 257/531 |

FOREIGN PATENT DOCUMENTS

| | | |
|---|---|---|
| JP | 62-157413 A | 7/1987 |
| JP | 62-189807 A | 8/1987 |
| JP | 3275416 B2 | 4/2002 |
| JP | 2005-229434 A | 8/2005 |

* cited by examiner

*Primary Examiner* — Robert Pascal
*Assistant Examiner* — Gerald Stevens
(74) *Attorney, Agent, or Firm* — Keating & Bennett, LLP

(57) ABSTRACT

A laminated filter includes a first insulation layer including first and second coil patterns and a first capacitor pattern and a second insulation layer including third and fourth coil patterns and second and third capacitor patterns. The first and second coil patterns are located near one longer side of the first insulation layer and connected to the third and fourth coil patterns through penetration electrodes in the first insulation layer. The third and fourth coil patterns extend to ends of the second insulation layer through extension patterns and are connected to external electrodes to define input and output inductors. The first capacitor pattern is located near the other longer side of the first insulation layer and connected to an external ground electrode through an extension pattern. The first capacitor pattern faces the second and third capacitor patterns with the first insulation layer interposed therebetween to define input and output capacitors.

7 Claims, 9 Drawing Sheets

LAMINATED FILTER

BACKGROUND OF THE INVENTION

1. Field of the Invention

The present invention relates to laminated filters and particularly relates to a laminated LC filter including a resonant circuit including an inductor and a capacitor.

2. Description of the Related Art

As a known technique, Japanese Unexamined Patent Application Publication No. 2005-229434 discloses a laminated filter 101 configured as shown in FIGS. 8 and 9, for example. FIG. 8 is an exploded perspective view illustrating the laminated filter 101, and FIG. 9 is a perspective view illustrating the appearance of the laminated filter 101. As shown in FIG. 8, the laminated filter 101 is configured such that a coil section 110 including coil patterns 111a to 116a and a capacitor section 130 including capacitor patterns 131a to 133a are laminated with each other in this order from the top.

The coil section 110 is configured such that insulation layers 111 to 116 including the coil patterns 111a to 116a formed thereon, respectively, are laminated on one another. The coil patterns 111a to 116a are electrically connected to one another in a helical manner at end portions thereof using penetration electrodes 111b to 115b disposed in the insulation layers 111 to 115, respectively.

The coil pattern 111a extends to an end portion of one of the shorter sides of the insulation layer 111 and is electrically connected to an external electrode 102 of the laminated filter 101. The coil pattern 116a extends to an end portion of one of the shorter sides of the insulation layer 116 which is an opposite side relative to the one of the shorter sides of the insulation layer 111 and is electrically connected to another external electrode 104 of the laminated filter 101.

The capacitor section 130 is configured such that insulation layers 131 to 133 having capacitor patterns thereon are laminated on one another. Capacitor patterns 131a and 133a are formed substantially in centers of the insulation layers 131 and 133, respectively, and have a substantially rectangular shape. The capacitor patterns 131a and 133a include a pair of extension patterns 131b and a pair of extension patterns 133b, respectively, which are exposed to end surfaces of respective longer sides of the laminated filter 101. The capacitor patterns 131a and 133a are electrically connected to an external ground electrode 106 through the extension patterns 131b and 133b.

The capacitor pattern 132a is formed in a substantially center of the insulation layer 132 and has a substantially rectangular shape. The capacitor pattern 132a includes an extension pattern 132b which is exposed to an end of one of the shorter sides of the laminated filter 101 and is electrically connected to the external electrode 102 through the extension pattern 132b.

The capacitor pattern 132a is disposed between the capacitor patterns 131a and 133a, and two capacitors are formed, that is, a capacitor including the capacitor patterns 132a and 131a with the insulation layer 131 interposed therebetween and a capacitor including the capacitor patterns 132a and 133a with the insulation layer 132 interposed therebetween.

In recent years, as high-frequency electronic apparatuses including cellular phones are miniaturized, miniaturization and reduction of height of electronic components have been demanded. In the known laminated filter 101, since only a coil pattern or only a capacitor pattern is formed on a single insulation layer, a certain number of insulation layers should be laminated on one another so that desired characteristics are obtained. Therefore, there arises a problem in that the number of insulation layers included in the laminated filter 101 increases and accordingly the height is not reduced.

Furthermore, in the known laminated filter 101, as shown in FIG. 8, the coil patterns 111a to 116a and the capacitor patterns 131a and 133a are laminated on one another in a lamination direction, and therefore, when current is supplied to the coil patterns 111a to 116a, a magnetic flux is generated through the capacitor patterns 131a to 133a. Accordingly, there arises a problem in that eddy current is generated in the capacitor patterns 131a to 133a and a Q characteristic of the laminated filter 101 is deteriorated due to eddy current loss.

Furthermore, in the known laminated filter 101, there arises another problem in that the Q characteristic of the laminated filter 101 is deteriorated due to undesired inductance components generated in an external electrode section since the coil section 110 and the capacitor section 130 are electrically connected to each other through the external electrodes 102 and 104.

SUMMARY OF THE INVENTION

Accordingly, preferred embodiments of the present invention provide a laminated filter which has a reduced number of insulation layers, which is small in height, and which has an excellent Q characteristic.

According to a preferred embodiment of the present invention, a laminated filter includes a plurality of insulation layers, coil patterns included in coils, capacitor patterns included in capacitors, and external electrodes. A region in which the coil patterns are provided and a region in which the capacitor patterns are provided are laminated so as not to overlap with each other in a lamination direction.

In this case, since the capacitor patterns are not required to be arranged in regions over and under the coil patterns which generate the largest magnetic flux, eddy-current loss generated in the capacitor patterns due to the magnetic flux of coils can be reduced and a Q characteristic of the filter is prevented from being deteriorated.

Furthermore, among the plurality of insulation layers, predetermined insulation layers each may include the coil patterns and the capacitor patterns.

In this case, since the coil patterns and the capacitor patterns are arranged on the same insulation layer, the number of insulation layers included in the laminated filter can be reduced resulting in reduction of height of the entire element.

Moreover, the coil patterns and the capacitor patterns may be connected to the same extension patterns and may be electrically connected to the external electrodes through the extension patterns.

In this case, since LC resonant circuits are configured without using the external electrodes, the influence of undesired inductance components generated in the external electrodes can be minimized and prevented, and an excellent Q characteristic can be realized.

In addition, the coil patterns may be electrically connected to the capacitor patterns, and thereafter, connected to the external electrodes through extension patterns which extend from the capacitor patterns.

In this case, since the coil patterns are directly connected to the capacitor patterns, the influence of undesired inductance components generated in the external electrodes can be minimized and prevented, and an excellent Q characteristic can be realized.

The laminated filter according to a preferred embodiment of the present invention may include two or more LC resonant circuits including the coil patterns and the capacitor patterns.

The coil patterns disposed on the insulation layer including the extension patterns disposed thereon may be connected to the capacitor patterns.

In this case, since distances between the coil patterns and extension electrodes on the insulation layer including the extension patterns connected to the external electrode can be made smaller, undesired inductance components are prevented from being generated and an excellent filter characteristic can be obtained.

Furthermore, a capacitor pattern which controls a coupling capacitance between the LC resonant circuits may be disposed on one of the insulation layers.

In this case, since the capacitor pattern which performs capacitance coupling among the LC resonant circuits is disposed on the insulation layer, the coupling capacitance between the LC resonant circuits can be controlled by changing an area of the capacitor pattern. Accordingly, a desired filter characteristic can be easily realized.

Furthermore, the capacitor pattern which controls the coupling capacitance may be sandwiched between the coil patterns and one of the capacitor patterns.

In this case, since the coil patterns and the capacitor patterns which are included in the LC resonant circuits can be arranged separately from each other with the capacitor pattern which is used for the capacitance coupling of the resonant circuits interposed therebetween, the coil patterns and the capacitor patterns included in the LC resonant circuits are prevented from being electromagnetically coupled with each other, and accordingly, an excellent filter characteristic can be obtained.

Furthermore, according to another preferred embodiment of the present invention, a laminated filter includes a plurality of insulation layers, coil patterns included in coils, capacitor patterns included in capacitors, and external electrodes. First and second coil patterns and first and second capacitor patterns are disposed on a first insulation layer and third and fourth coil patterns and third and fourth capacitor patterns are disposed on a second insulation layer. The first and second coil patterns which have substantially U-shapes symmetrically arranged with respect to a line and the third and fourth coil patterns which have substantially U-shapes symmetrically arranged with respect to a line are disposed near one of longer sides of the first insulation layer and one of longer sides of the second insulation layer, respectively, and one end of the first coil pattern and one end of the second coil pattern are connected to one end of the third coil pattern and one end of the fourth coil pattern, respectively, through penetrate electrodes which penetrate the first insulation layer. The first and second capacitor patterns and the third and fourth capacitor patterns are arranged near the other of the longer sides of the first insulation layer and the other of the longer sides of the second insulation layer, respectively, so as to face with each other with the first insulation layer interposed therebetween. The other end of the third coil pattern and the other end of the fourth coil pattern are connected to the third and fourth capacitor patterns, respectively, on the second insulation layer. A capacitor defined by the first and third capacitor patterns and an inductor defined by the first and third coil patterns are included in a first LC resonant circuit. A capacitor defined by the second and fourth capacitor patterns and an inductor defined by the second and fourth coil patterns are included in a second LC resonant circuit. The second capacitor pattern is disposed between the first capacitor pattern and the first and second coil patterns so as to control a coupling capacitance between the first and second LC resonant circuits. A region including the first to fourth capacitor patterns and a region including the first to fourth coil patterns do not overlap with each other in a lamination direction.

In this case, since resonant frequencies of the LC resonant circuits and the coupling capacitance can be independently controlled, the degree of design freedom is increased. Furthermore, since the coil patterns are directly connected to the capacitor patterns, the influence of undesired inductance components can be minimized and prevented, and an excellent Q characteristic can be realized.

Moreover, the coil patterns may preferably have substantially helical shapes.

In this case, since the coil patterns preferably have substantially helical shapes, the coil patterns can be formed in a small area. Accordingly, miniaturization of the filter can be realized.

According to the various preferred embodiments of the present invention, since the region in which the coil patterns are disposed and the region in which the capacitor patterns are disposed are arranged so as not to overlap with each other in the lamination direction, the capacitor patterns are not required to be arranged in the regions over and under the coil patterns which generate the largest magnetic flux. Consequently, eddy-current loss generated in the capacitor patterns due to the magnetic flux of coils can be reduced and a Q characteristic of the filter is prevented from being deteriorated.

The above and other features, elements, characteristics, steps and advantages of the present invention will become more apparent from the following detailed description of preferred embodiments of the present invention with reference to the attached drawings.

DETAILED DESCRIPTION OF THE PREFERRED EMBODIMENTS

Preferred embodiments of a laminated filter according to the present invention will be described hereinafter with reference to the accompanying drawings.

Figure 1:
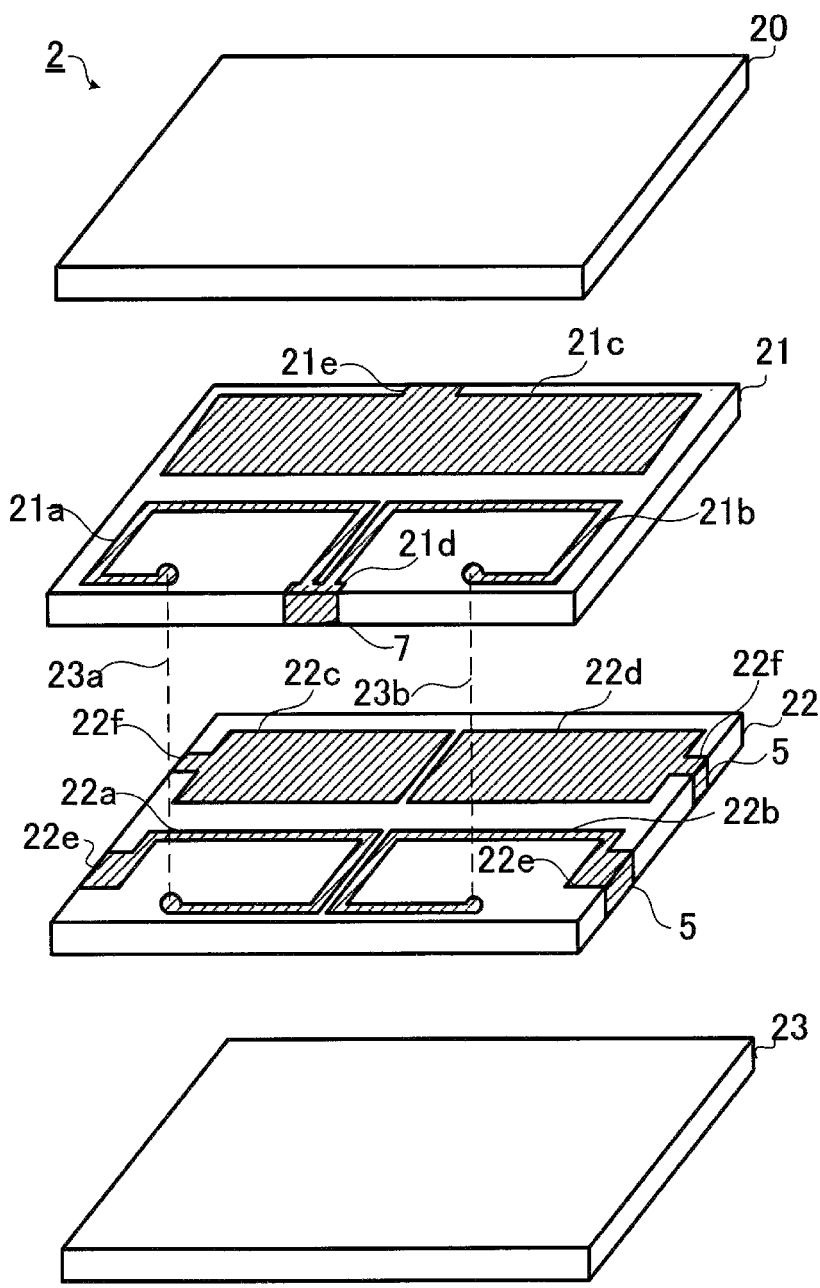
FIG. 1 is an exploded perspective view illustrating a configuration of a laminated filter according to a first preferred embodiment of the present invention.
Figure 2:
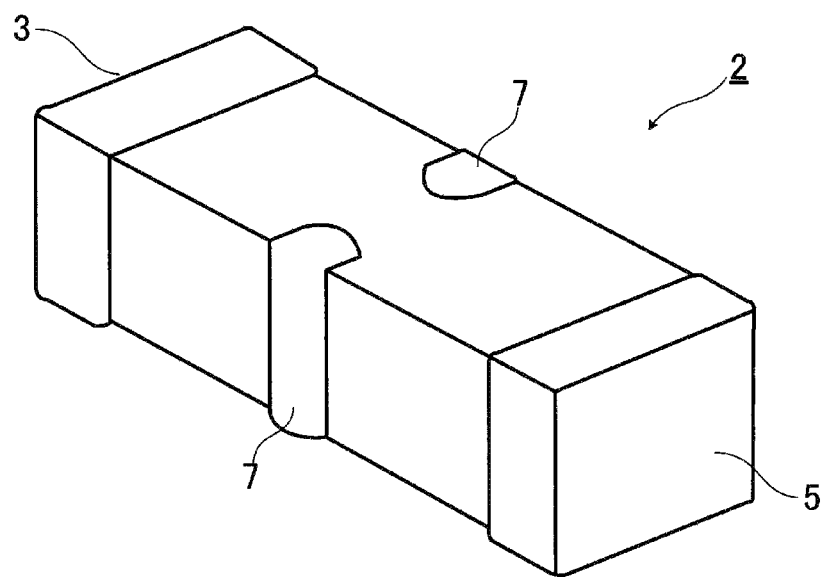
FIG. 2 is a perspective view illustrating the appearance of the laminated filter according to the first preferred embodiment of the present invention.
Figure 3:
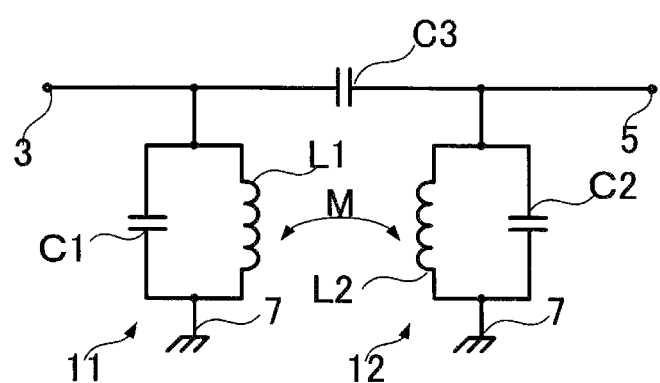
FIG. 3 is a diagram illustrating an equivalent circuit of the laminated filter shown in FIGS. 1 and 2.

First Preferred Embodiment (FIGS. 1 to 3)

A configuration of a laminate filter 2 according to a first preferred embodiment of the present invention is shown in FIGS. 1 to 3. FIG. 1 is an exploded perspective view illustrating the laminated filter 2. FIG. 2 is a perspective view illustrating the appearance of the laminated filter 2. FIG. 3 is a diagram illustrating an equivalent circuit of the laminated filter 2. As shown in FIG. 1, the laminated filter 2 includes an insulation layer 21 including coil patterns 21a and 21b and a capacitor pattern 21c disposed on a surface thereof, an insulation layer 22 including coil patterns 22a and 22b and capacitor patterns 22c and 22d disposed on a surface thereof, and dummy insulation layers 20 and 23.

The insulation layers 20 to 23 are manufactured preferably by applying slurry formed of ceramic dielectric material such as barium titanate to films by a doctor blade method.

The coil patterns 21a, 21b, 22a, and 22b and the capacitor patterns 21c, 22c, and 22d are formed preferably by applying photosensitive conductive paste on the insulation layers by a spin coat method and being subjected to a photolithography method. Alternatively, they may be formed by performing screen printing such that conductive paste is directly printed on the insulation layers.

The coil patterns 21a and 21b having substantially U-shaped configurations are disposed near one of longer sides of the insulation layer 21 and are symmetrically arranged with respect to a line. The coil patterns 22a and 22b having substantially U-shapes are arranged near one of longer sides of the insulation layer 22 and are symmetrically arranged with respect to a line.

One end of the coil pattern 21a and one end of the coil pattern 21b are electrically connected to the coil patterns 22a and 22b through penetration electrodes 23a and 23b, respectively, so as to define helical coils. The other end of the coil pattern 21a and the other end of the coil pattern 21b are electrically connected to an external ground electrode 7 through an extension pattern 21d which is disposed so as to be exposed to one of the longer sides of the insulation layer 21.

The coil patterns 22a and 22b extend toward respective shorter sides of the insulation layer 22 so as to be exposed to the shorter sides of the insulation layer 22 through extension patterns 22e arranged on the opposite shorter sides of the insulation layer 22 so as to be electrically connected to external electrodes 3 and 5. As a result, an input-side inductor L1 and an output-side inductor L2 are defined by the coil patterns 21a and 21b and the coil patterns 22a and 22b.

The capacitor pattern 21c preferably having a substantially rectangular shape is disposed near the other longer side of the insulation layer 21 and extends toward the other longer side of the insulation layer 21 through an extension pattern 21e disposed substantially in a center of one of longer sides of the capacitor pattern 21c so as to be exposed to an end portion of the other longer side of the insulation layer 21. As a result, the capacitor pattern 21c is connected to the external ground electrode 7.

The capacitor patterns 22c and 22d preferably having substantially rectangular shapes face the capacitor pattern 21c with the insulation layer 21 interposed therebetween, and are disposed near the other of the longer sides of the insulation layer 22 so as to be substantially symmetrical with each other with respect to a line. The capacitor patterns 22c and 22d are electrically connected to the external electrodes 3 and 5, respectively, through extension patterns 22f, and include an input-side capacitor C1 and an output-side capacitor C2.

The insulation layers 20, 21, 22, and 23 configured as described above are laminated with one another in this order from the top and then fired or sintered. Thereafter, the external electrodes 3 and 5 and the external ground electrode 7 are formed. In this way, the laminated filter 2 shown in FIG. 2 is obtained. The input electrode 3 and the output electrode 5 are disposed on the respective shorter sides of the laminated filter 2, and the external ground electrode 7 is disposed on the longer sides of the laminated filter 2.

As shown in the exploded perspective view of FIG. 1, in the laminated filter 2, the coil patterns and the capacitor patterns preferably are simultaneously formed on each of the insulation layers. Therefore, when compared with a known laminated filter in which a coil pattern and a capacitor pattern are formed on respective insulation layers, the number of required layers can be reduced and reduction of height of the element can be attained.

Furthermore, in the laminated filter 2 shown in FIG. 1, regions in which the coil patterns are disposed and regions in which the capacitor patterns are disposed are not overlapped with one another. Therefore, since the capacitor patterns are not arranged in regions over and under the coil patterns which generate the largest magnetic flux, eddy-current loss generated in the capacitor patterns due to the magnetic flux of coils can be reduced and a Q characteristic of the filter is prevented from being deteriorated.

Figure 4:
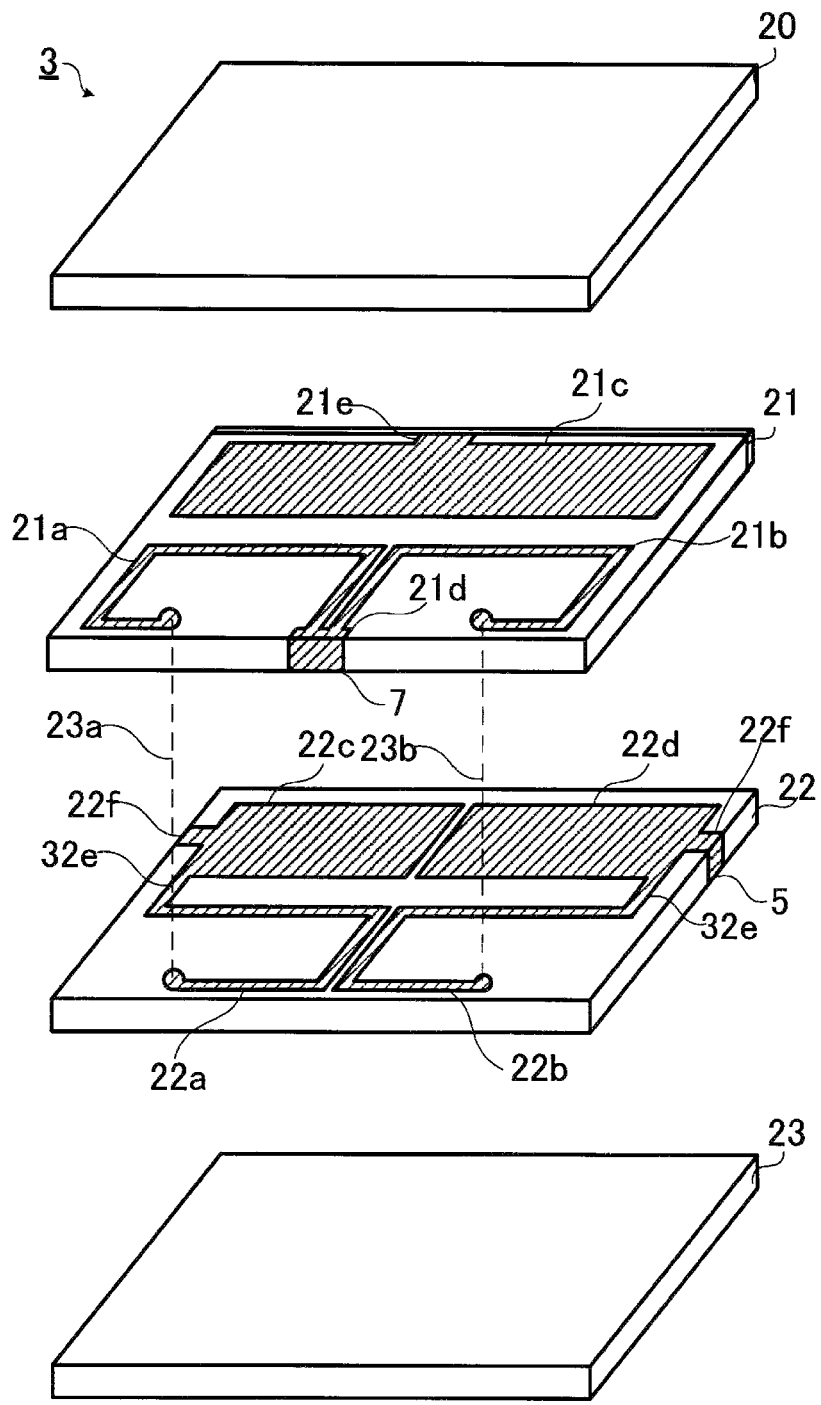
FIG. 4 is an exploded perspective view illustrating a configuration of a laminated filter according to a second preferred embodiment of the present invention.

Second Preferred Embodiment (FIG. 4)

A configuration of a laminated filter 30 according to a second preferred embodiment of the present invention will be described with reference to FIG. 4. FIG. 4 is an exploded perspective view illustrating the laminated filter 30 according to the second preferred embodiment. The appearance of the laminated filter 30 is the same as that shown in FIG. 2, and therefore, a description thereof is omitted. The laminated filter 30 of the second preferred embodiment includes extension patterns 32e instead of the extension patterns 22e of the first preferred embodiment. Note that components shown in FIG. 4 corresponding to those shown in FIG. 1 are denoted by reference numerals the same as those shown in FIG. 1, and therefore, redundant descriptions thereof are omitted.

The extension patterns 32e are disposed on end portions of coil patterns 22a and 22b which are located near the capacitor patterns 22c and 22d so that the capacitor patterns 22c and 22d and coil patterns 22a and 22b are directly electrically connected to each other, respectively, on an insulation layer 22.

In the laminated filter 30 configured as described above, the coil patterns 22a and 22b are directly connected to the capacitor patterns 22c and 22d, respectively, through the extension patterns 32e and are connected to the external electrodes 3 and 5 through extension patterns 22f. With this arrangement, an LC resonant circuit is configured without using the external electrodes 3 and 5, and the extension patterns 32e which connect the coil patterns and the capacitor patterns to each other are made shorter. Accordingly, undesired inductance components generated in the external electrodes 3 and 5 can be reduced, and a laminated filter having an excellent Q characteristic is realized.

Figure 5:
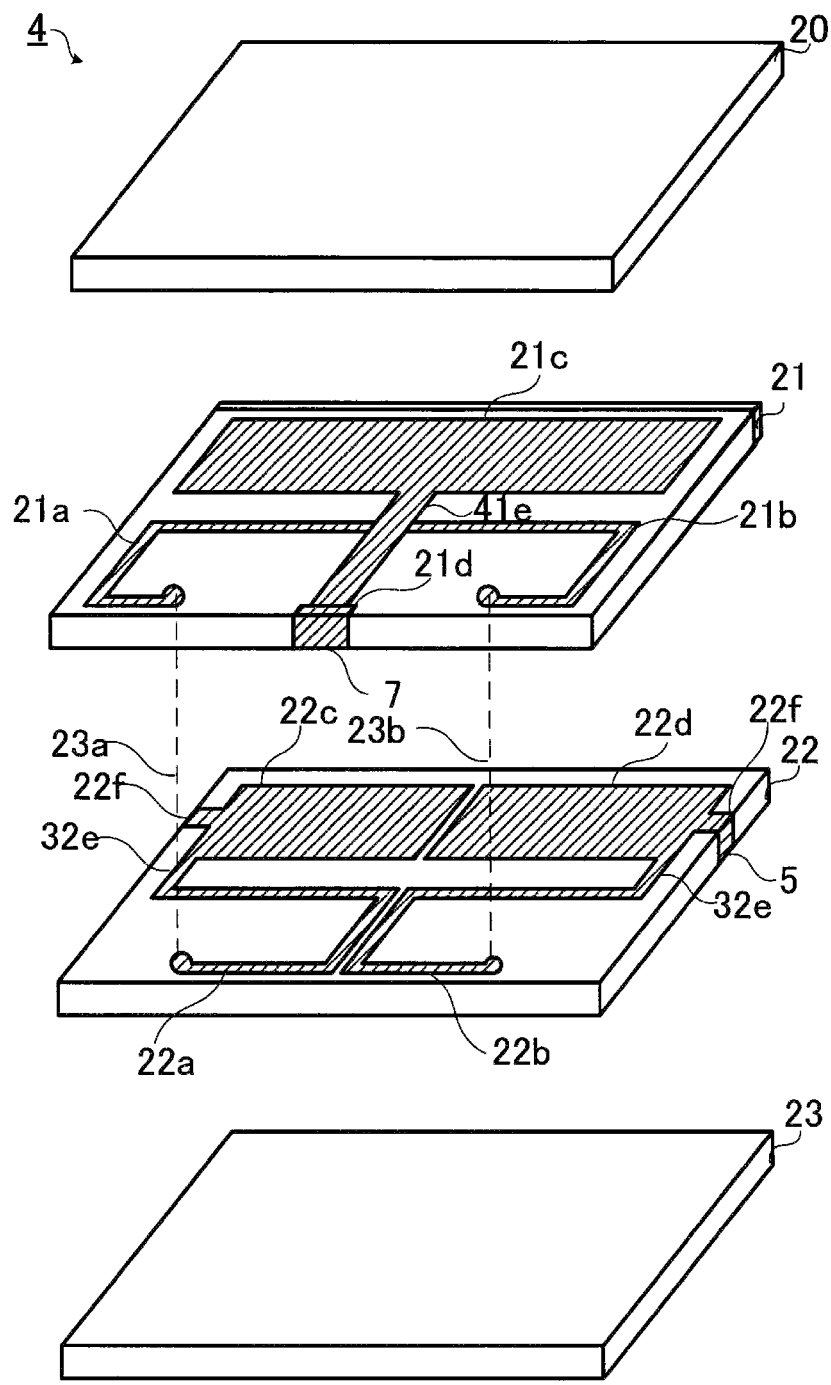
FIG. 5 is an exploded perspective view illustrating a configuration of a laminated filter according to a third preferred embodiment of the present invention.

Third Preferred Embodiment (FIG. 5)

A configuration of a laminated filter 4 according to a third preferred embodiment of the present invention will be described with reference to FIG. 5. FIG. 5 is an exploded perspective view of the laminated filter 4 according to the third preferred embodiment. The appearance of the laminated filter 4 is the same as that shown in FIG. 2, and therefore, a description thereof is omitted. The laminated filter 4 of the third preferred embodiment has an extension pattern 41e instead of the extension pattern 21e of the second preferred embodiment. Note that, in FIG. 5, components corresponding to those shown in FIG. 4 are denoted by reference numerals the same as those used in FIG. 4, and redundant descriptions thereof are omitted.

The extension pattern 41e is disposed substantially in a center of one of longer sides of a capacitor pattern 21c and extends to one of the longer sides which is near coil patterns 21a and 21b. The coil patterns 21a and 21b are connected to the extension pattern 41e, and therefore, are finally electrically connected to an external ground electrode 7 through an extension pattern 21d which is disposed at the longer side of the insulation layer 22.

In the laminated filter 4 configured as described above, two LC resonant circuits including the coil patterns 21a, 21b, 22a, and 22b and the capacitor pattern 21c, 22c, and 22d are electrically connected to each other without using the external input/output electrodes 3 and 5 and the external ground electrode 7. Therefore, a Q characteristic is not deteriorated due to undesired inductance components generated in an external electrode section, and therefore, the laminated filter 4 having an excellent characteristic can be realized.

Figure 6:
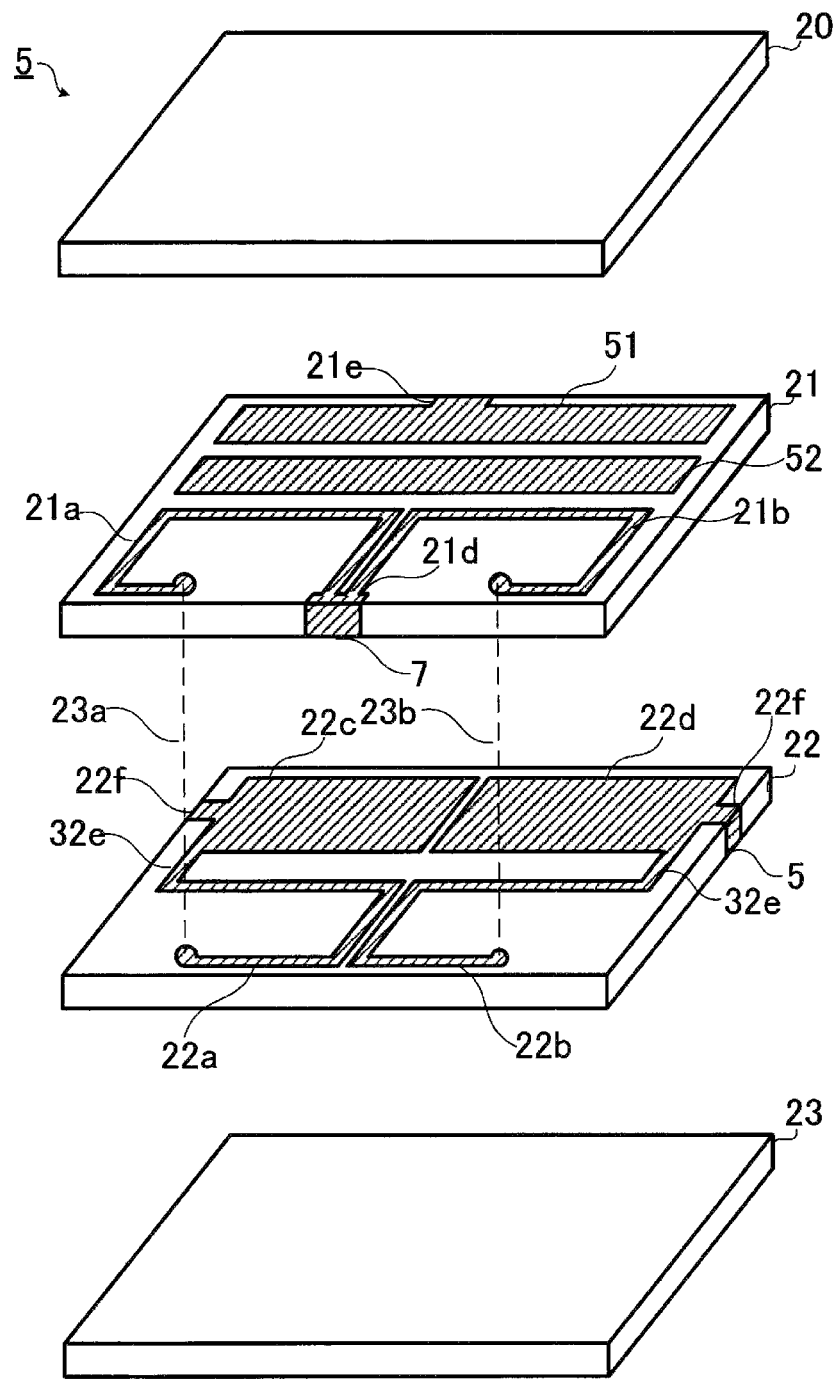
FIG. 6 is an exploded perspective view illustrating a configuration of a laminated filter according to a fourth preferred embodiment of the present invention.

Fourth Preferred Embodiment (FIG. 6)

A configuration of a laminated filter 5 according to a fourth preferred embodiment of the present invention will be described with reference to FIG. 6. FIG. 6 is an exploded perspective view illustrating the laminated filter 5 of the fourth preferred embodiment. An equivalent circuit is the same as that shown in FIG. 3, and therefore, a description thereof is omitted. The laminated filter 5 includes a capacitor pattern 52 which controls a coupling capacitance and which is located between coil patterns 21a and 21b and a capacitor pattern 51 on an insulation layer 21. Note that, in FIG. 6, components corresponding to those shown in FIG. 4 are represented by reference numerals the same as those shown in FIG. 4, and therefore, redundant descriptions thereof are omitted.

The capacitor pattern 51 is disposed on the insulation layer 21 in a region far from the coil patterns 21a and 21b with a predetermined interval from the coil patterns 21a and 21b.

The capacitor pattern 51 faces portions of the capacitor patterns 22c and 22d with the insulation layer 21 interposed therebetween so that an input-side capacitor C1 and an output-side capacitor C2 are formed.

A capacitor pattern 52 is disposed between the capacitor pattern 51 and the coil patterns 21a and 21b and faces portions of the capacitor patterns 22c and 22d with the insulation layer 21 interposed therebetween so that a capacitor C3 is formed.

As shown in FIGS. 3 and 6, the capacitor C3 is disposed between an input-side LC resonant circuit 11 and an output-side LC resonant circuit 12. Therefore, even when resonant frequencies of the LC resonant circuits 11 and 12 are changed, a degree of coupling between the LC resonant circuits is easily controlled by changing an area of the capacitor pattern 52. Accordingly, a degree of freedom of design of characteristics of a filter, and a filter having desired characteristics can be easily realized. Furthermore, since the coil patterns 21a and 21b and the capacitor patterns 22c and 22d are disposed with a gap interposed therebetween due to presence of the capacitor pattern 52, electromagnetic coupling between the coil patterns 21a and 21b and the capacitor patterns 22c and 22d which are included in the LC resonant circuits 11 and 12 can be prevented and minimized, and accordingly, excellent filter characteristics is realized.

Figure 7:
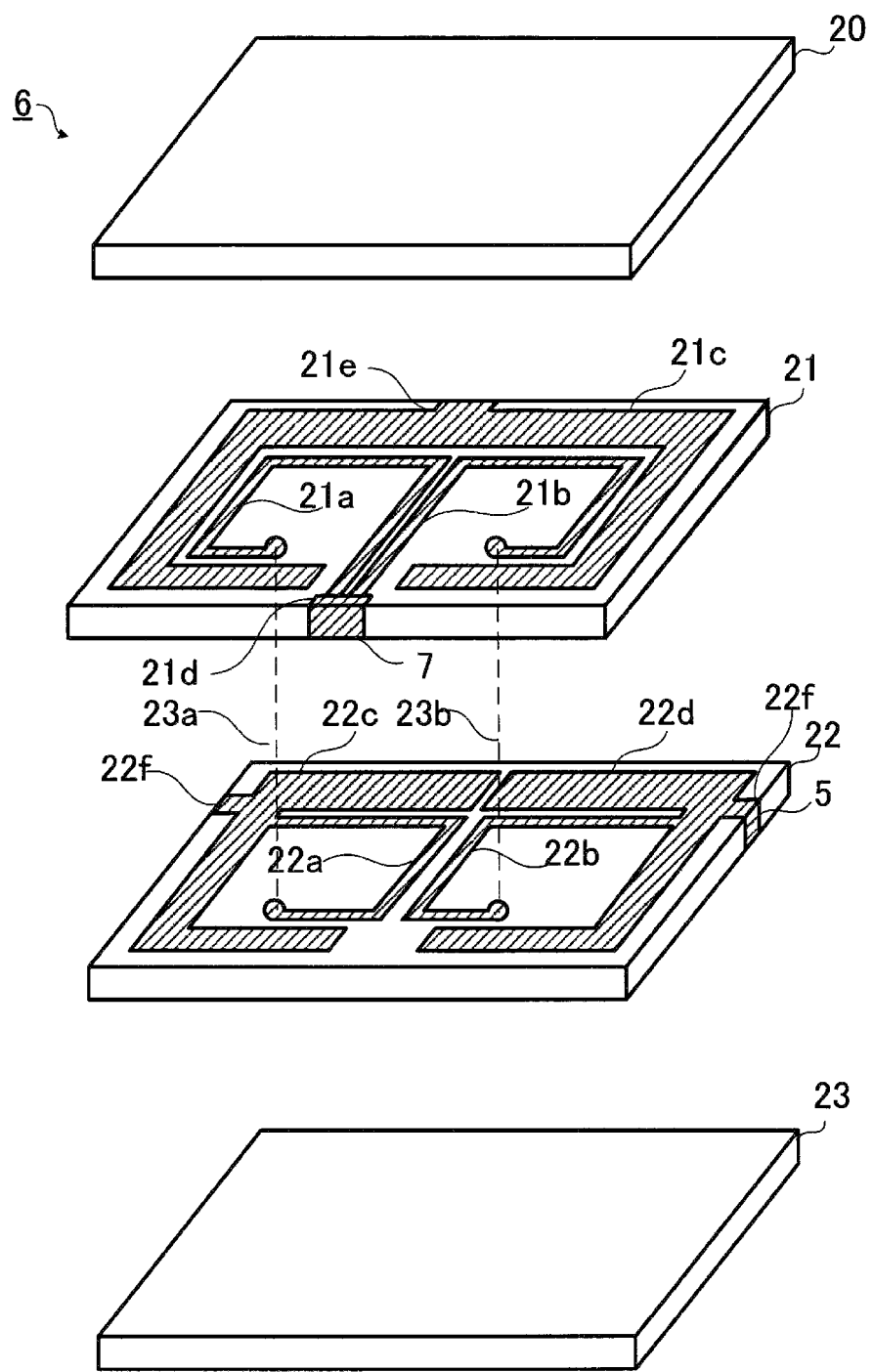
FIG. 7 is an exploded perspective view illustrating a configuration of a laminated filter according to a fifth preferred embodiment of the present invention.
Figure 8:
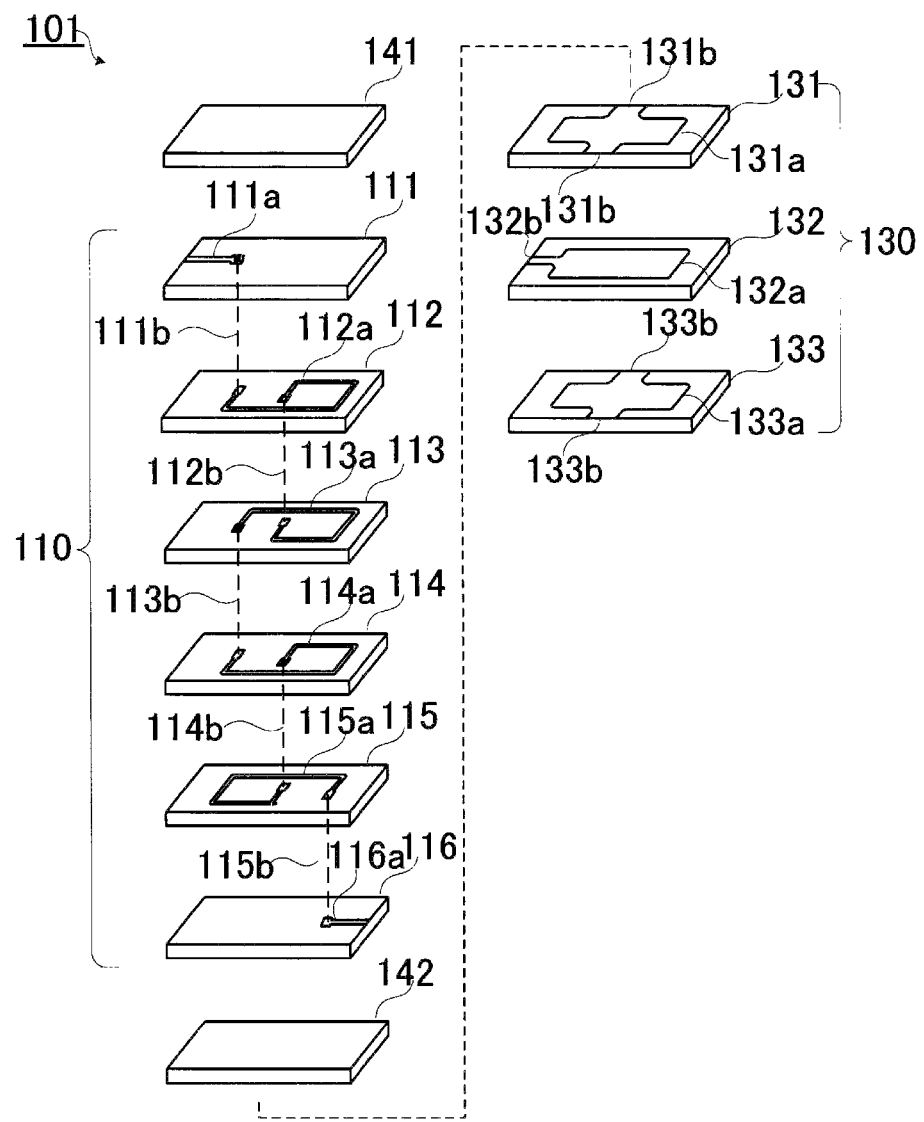
FIG. 8 is an exploded perspective view illustrating a known laminated filter.
Figure 9:
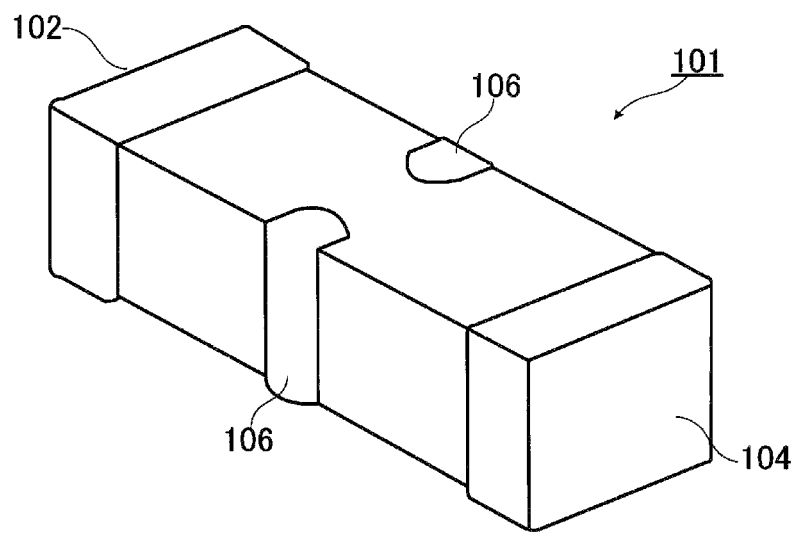
FIG. 9 is a perspective view illustrating the appearance of the known laminated filter.

Fifth Preferred Embodiment (FIG. 7)

A configuration of a laminated filter 6 according to a fifth preferred embodiment of the present invention will be described with reference to FIG. 7. FIG. 7 is an exploded perspective view illustrating the laminated filter 6 according to the fifth preferred embodiment. The appearance of the laminated filter 6 is the same as that show in FIG. 2, and therefore, a description thereof is omitted. The laminated filter 6 includes coil patterns 21a and 21b and coil patterns 22a and 22b located in substantially centers of insulation layers 21 and 22, respectively. The coil patterns 21a and 21b and the coil patterns 22a and 22b are electrically connected to each other through penetrate electrodes 23a and 23b, respectively, so as to define helical coils.

A capacitor pattern 21c and capacitor patterns 22c and 22d are disposed on the insulation layers 21 and 22, respectively, so as to surround the coil patterns 21a and 21b and the coil patterns 22a and 22b, respectively.

The coil patterns 21a and 21b are electrically connected to an external ground electrode 7 through an extension pattern 21d disposed on one of longer sides of the insulation layer 21. The coil patterns 22a and 22b are electrically connected to external filters 3 and 5 through the capacitor patterns 22c and 22d.

The capacitor pattern 21c is electrically connected to the external ground electrode 7 through an extension pattern 21e disposed on the other of the longer sides of the insulation layer 21 and is arranged so as to face the capacitor patterns 22c and 22d with the insulation layer 21 interposed therebetween. The capacitor patterns 22c and 22d are electrically connected to the external filters 3 and 5 through extension patterns 22f which are disposed on respective shorter sides of the insulation layer 22.

As shown in FIG. 7, in the laminated filter 6, the capacitor pattern 21c and the capacitor patterns 22c and 22d are arranged so as to surround the coil patterns 21a and 21b and the coil patterns 22a and 22b, respectively. With this arrangement, the capacitor patterns 21c, 22c, and 22d prevent magnetic flux generated in coils from leaking to an outside of the coils, and accordingly, influence of a magnetic field to external circuits can be reduced and a laminated filter having an excellent Q characteristic which is barely deteriorated is realized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated filter comprising:
   a plurality of insulation layers;
   coil patterns included in coils;
   capacitor patterns included in capacitors; and
   external electrodes including an external ground electrode;
   wherein
   a region in which the coil patterns are located and a region in which the capacitor patterns are located are laminated so as not to overlap with each other in a lamination direction;
   one of the capacitor patterns is connected to the external ground electrode;
   at least one of the coil patterns and the one of the capacitor patterns connected to the external ground electrode are disposed on a common one of the plurality of insulation layers;
   at least two of the capacitors share a common one of the capacitor patterns; the common one of the capacitor patterns is electrically connected directly to one of the external electrodes;

the coil patterns include first, second, third, and fourth coil patterns;

the capacitor patterns include first, second, third, and fourth capacitor patterns;

the first and second coil patterns and the first and second capacitor patterns are disposed on a first one of the plurality of insulation layers; and the third and fourth coil patterns and the third and fourth capacitor patterns are disposed on a second one of the plurality of insulation layers different from the first one of the plurality of insulation layers.

2. The laminated filter according to claim 1, wherein the coil patterns and the capacitor patterns are connected to common extension patterns and are electrically connected to the external electrodes through the common extension patterns.

3. The laminated filter according to claim 1, wherein the coil patterns are electrically connected to the capacitor patterns, and are connected to the external electrodes through extension patterns which extend from the capacitor patterns.

4. The laminated filter according to claim 3, comprising:

at least two LC resonant circuits including the coil patterns and the capacitor patterns, wherein the coil patterns disposed on one of the plurality of insulation layers including the extension patterns disposed thereon are connected to the capacitor patterns.

5. The laminated filter according to claim 4, wherein one of the capacitor patterns is arranged to control a coupling capacitance between the at least two LC resonant circuits and is disposed on one of the insulation layers.

6. The laminated filter according to claim 5, wherein the one of the capacitor patterns arranged to control said coupling capacitance is sandwiched between the coil patterns and another one of the capacitor patterns in a plan view.

7. The laminated filter according to claim 1, wherein the coil patterns have substantially helical shapes.

* * * * *